(12) United States Patent
Han et al.

(10) Patent No.: US 6,929,958 B2
(45) Date of Patent: Aug. 16, 2005

(54) METHOD TO MAKE SMALL ISOLATED FEATURES WITH PSEUDO-PLANARIZATION FOR TMR AND MRAM APPLICATIONS

(75) Inventors: Cherng-Chyi Han, San Jose, CA (US); Rodney E. Lee, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 69 days.

(21) Appl. No.: 10/719,723

(22) Filed: Nov. 21, 2003

(65) Prior Publication Data

US 2005/0112902 A1    May 26, 2005

(51) Int. Cl.[7] .............................................. H01L 21/00
(52) U.S. Cl. ........................... 438/3; 438/381; 438/577
(58) Field of Search ............................ 438/3, 238, 381, 438/382, 577

(56) References Cited

U.S. PATENT DOCUMENTS

| | | | |
|---|---|---|---|
| 6,493,926 B2 | 12/2002 | Han et al. | 29/603.14 |
| 6,522,573 B2 | 2/2003 | Saito et al. | 365/158 |
| 6,562,199 B2 | 5/2003 | Shimazawa et al. | 204/192.1 |
| 6,572,917 B2 * | 6/2003 | Narisawa et al. | 427/130 |
| 6,610,602 B2 * | 8/2003 | Gambino et al. | 438/689 |
| 6,780,738 B2 * | 8/2004 | Kamijima | 438/3 |

* cited by examiner

*Primary Examiner*—Chandra Chaudhari
(74) *Attorney, Agent, or Firm*—George O. Saile; Stephen B. Ackerman

(57) ABSTRACT

A method for forming small, isolated device structures by photolithography, utilizing overlapping bi-layer suspension-bridge shaped photomasks. The use of a suspended mask to define a device shape beneath it eliminates the problems associated with uneven undercutting of the usual bi-layer mask which is a stencil portion formed on a lower pedestal. In particular, the use of a suspended mask eliminates undesirable dielectric buildup around the device caused by an insufficiently undercut pedestal or of premature mask lift-off caused by an overly undercut pedestal.

8 Claims, 6 Drawing Sheets

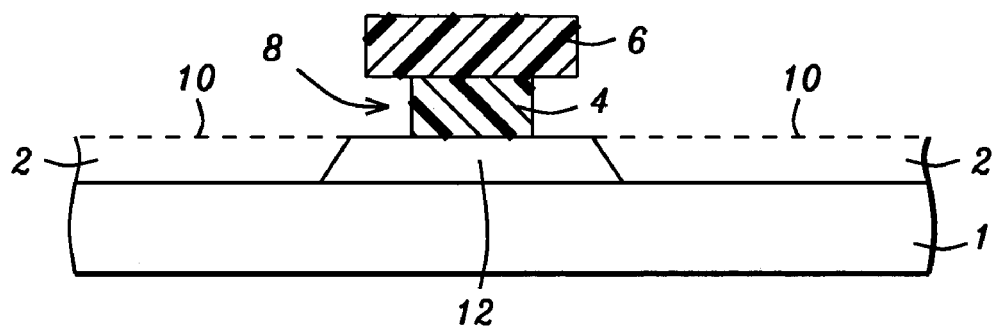
FIG. 1a – Prior Art
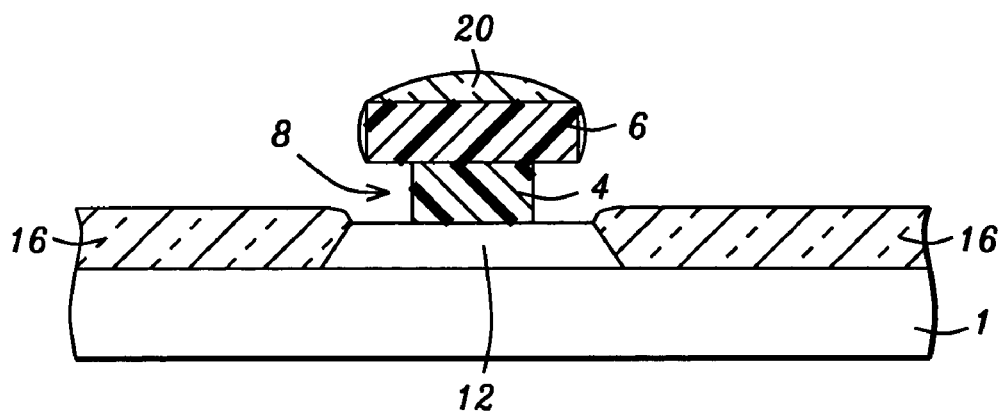
FIG. 1b – Prior Art
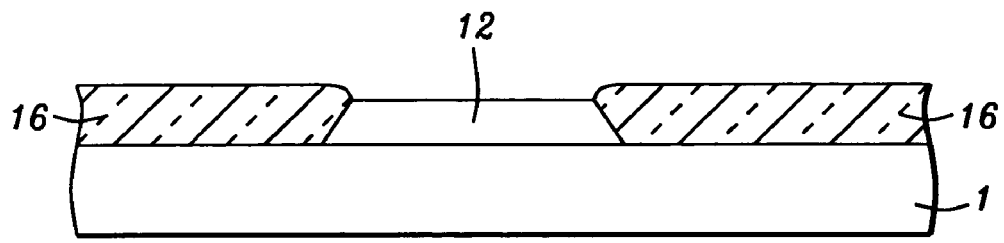
FIG. 1c – Prior Art

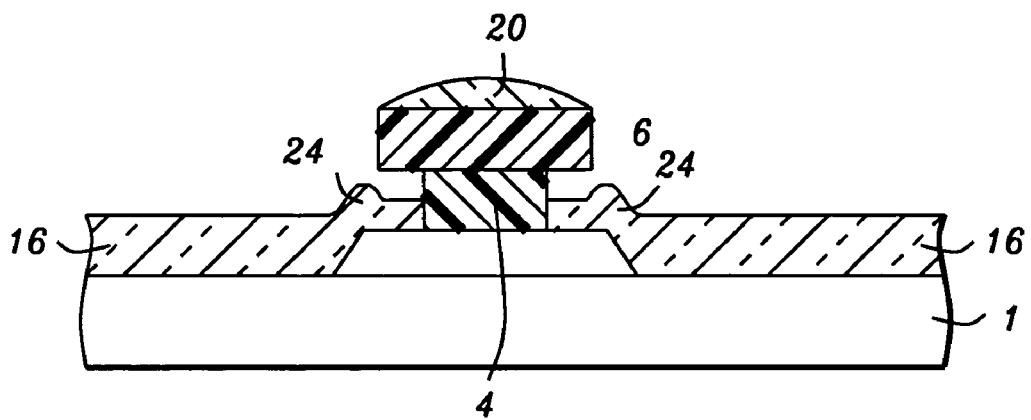
*FIG. 1d – Prior Art*
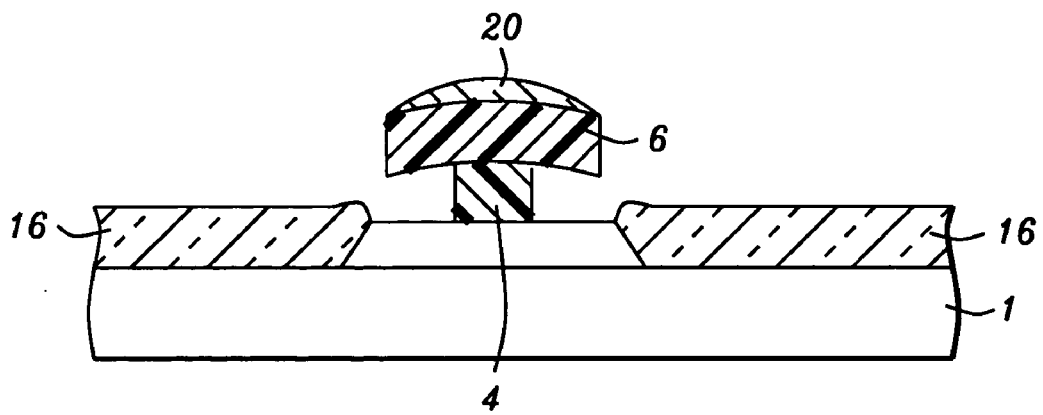
*FIG. 1e – Prior Art*
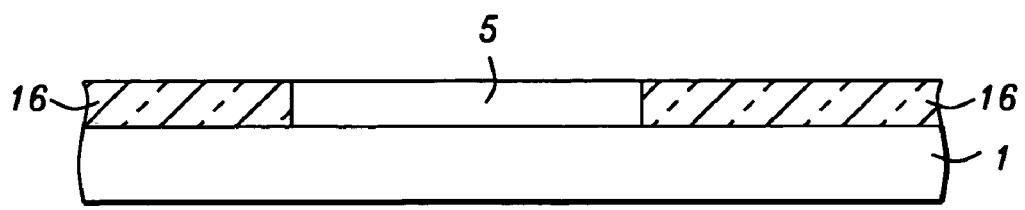
*FIG. 2*

METHOD TO MAKE SMALL ISOLATED FEATURES WITH PSEUDO-PLANARIZATION FOR TMR AND MRAM APPLICATIONS

BACKGROUND OF THE INVENTION

1. Field of the Invention

This invention relates generally to the fabrication of microelectronic devices, such as MRAM (magnetic random access memory) or TMR (tunneling magnetoresistive) devices, and relates particularly to a photolithographic process using suspension-bridge shaped masks for the formation of small, isolated device features.

2. Description of the Related Art

The formation of small individual device features within microelectronic fabrications generally makes use of photolithographic patterning. Such patterning can be subtractive or additive. Subtractive patterning involves the deposition of a large structure upon a pre-existing fabrication, followed by the removal of portions of that structure to leave behind the smaller feature which is required. Additive patterning involves the formation of the small feature directly upon the pre-existing fabrication. Either approach is implemented by the formation of a photolithographic mask, which is usually a bi-layer mask called a lift-off mask. Such a lift-off mask, whose use is well known in the art and which is shown schematically in FIG. 1a when used in a subtractive process, is formed in two layers: a relatively wide upper portion (6) resting upon a narrower lower pedestal portion (4) which is undercut (8). The edges of the upper portion are symmetrically disposed about the pedestal. The mask can be used as an etching mask to remove portions (10) (shown in broken lines) of a device layer (2) (such as a layer of conducting material or a magnetically active layer) which is formed on a substrate (1). A portion (12), of a desired shape, remains. Typically, as shown in FIG. 1b, the removed portions ((10) in FIG. 1a) are then filled in with a dielectric material (16), now using the mask as a deposition mask, and the mask (covered with residue (20)) is subsequently lifted off by dissolving its pedestal. As shown schematically in FIG. 1c, the portion of the layer left behind (12) after mask removal, is the desired small feature and it is now surrounded by an insulating dielectric (16). The entire surface may now be planarized for additional process steps.

The use of lift-off masks for forming small device features has certain disadvantages, which are a result of the difficulties in forming small, uniformly undercut pedestal layers. As shown in FIG. 1d, the non-uniformity of these layers due to undercut control problems can lead to either the buildup of deposited material (24), called "fencing," around the edges of the mask (if the undercut is insufficient) or, as shown in FIG. 1e, to the collapse of the mask entirely (if the undercut is too extreme). These difficulties and a method of eliminating them have been disclosed by Han et al. (U.S. Pat. No. 6,493,926 B2), which is assigned to the same assignee as the present application and which is fully incorporated herein by reference. Han discloses a the formation and use of a novel suspension-bridge shaped mask, whereby a small giant magnetoresistive (GMR) sensor is formed within an opening beneath a suspended overhanging region, thereby eliminating the problems associated with a non-uniform pedestal if the GMR sensor were formed using the prior-art bi-layer stencil. The present invention extends the suspension-bridge type stencil to the formation of small isolated device structures required in the fabrication of MRAM devices and TMR structures. To achieve the advantageous results of the suspension-bridge type mask in the present circumstances, it is required that two overlapping suspension-bridge type masks be used in a novel sequence and mask configuration.

Small TMR device structures and methods for forming them are disclosed by Shimazawa et al. (U.S. Pat. No. 6,562,199 B2) and by Saito et al. (U.S. Pat. No. 6,522,573 B2). Neither of these inventions include the use of single or multiple suspension-bridge type photolithographic masks in forming the small device structures.

SUMMARY OF THE INVENTION

A first object of this invention is to provide photolithographic method for forming small isolated devices within microelectronics processes such as those associated with MRAM, GMR and TMR microelectronics fabrications.

A second object of this invention is to provide such a photolithographic method which utilizes masks which are not subject to disadvantageous variablilty of shape and size.

In accord with the objects of this invention there is provided a photolithographic process using two suspension-bridge shaped masks which are applied successively in an overlapping configuration that allows the formation of a small device. This dual suspended mask structure avoids the disadvantages of bi-layer type lift-off masks with undercut pedestals. These latter masks define the device as a region beneath an upper mask portion which is supported by an undercut pedestal portion of the mask which is directly beneath the upper portion and which actually contacts the surface of the device being formed. The pedestal portion is subject to variability of shape and size as a result of undercut control problems which become more severe as the devices themselves become increasingly small. These undercut control problems are completely eliminated by a mask design in which there is no pedestal region beneath the central region of the mask, but rather the central portion is supported on either side so that there is nothing beneath it. By applying two such masks in succession, the first mask allows a first patterned device to be formed, then the second mask is placed orthogonally over this first patterned device and it is used to remove all but the desired final patterned portion. Since each mask is used not only to etch away portions of a lower layer but also to guide the subsequent deposition of a dielectric refill layer, the final device shape is surrounded by a dielectric layer whose upper surface is co-planar with the upper surface of the device.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein:

FIGS 1a–1e schematically show the use of a prior-art bi-layer lift-off mask of the type to be replaced by the mask of the present invention. The figures illustrate various problems associated with the prior-art mask.

FIGS. 2, 3, 4a, 4b, 4c, 5, 6a and 6b schematically show the sequential process steps in using the suspension-bridge type mask of the present invention in forming a small, isolated TMR device structure.

DESCRIPTION OF THE PREFERRED EMBODIMENTS

The preferred embodiment of the present invention is a suspension-bridge shaped photolithographic mask which can be advantageously used to form small, isolated device structures with microelectronics fabrications such as MRAM or TMR fabrications. The preferred embodiment will be described by reference to the formation of a small TMR device which is surrounded by an insulating region for device isolation. The TMR device formation illustrated by the figures is the patterning of a larger TMR film (ie. a laminated structure of active magnetic layers and interposed tunneling layers) into a required smaller shape and the surrounding of the smaller shaped TMR film by an isolating insulating layer. It is understood that this particular embodiment can equally well be described by referring to the comparable photolithographic process applied to an MRAM or similar fabrication process.

Referring first to FIG. 2, there is shown a schematic cross-sectional view of a substrate (1) upon which has been formed a patterned bottom electrode (5) which is surrounded by a dielectric layer (16). The upper surface of the electrode and surrounding dielectric has been rendered planar by a planarization process. It is understood that the electrode patterning and surrounding dielectric layer formation can be done using methods of the prior art, such as by first depositing a blanket electrode layer, removing portions by ion-beam etch (IBE) and refilling the removed portions with the dielectric layer. Because of the relatively large electrode area, the etch and dielectric refill can be done using the prior-art bi-layer lift-off mask, which is found to be unsuitable for the subsequent small device formation in the present invention. The process of electrode formation is not a part of the present invention and is, therefore, not shown.

Figure 3:
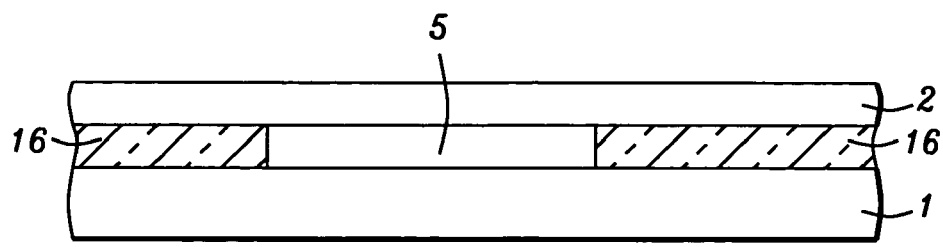

Referring next to FIG. 3, there is shown the formation of FIG. 2 wherein a TMR film (2) has now been formed on the bottom electrode (5) and surrounding dielectric layer (16). The TMR film is a laminated structure comprising magnetic layers and tunneling junction layers and the details of its formation are well known in the art and are not a part of the present invention. The present invention will comprise the patterning of the TMR film subsequent to its formation. It is equally well understood that the TMR film could be an MRAM film or a GMR film, depending upon the particular device being fabricated.

Figure 4A:
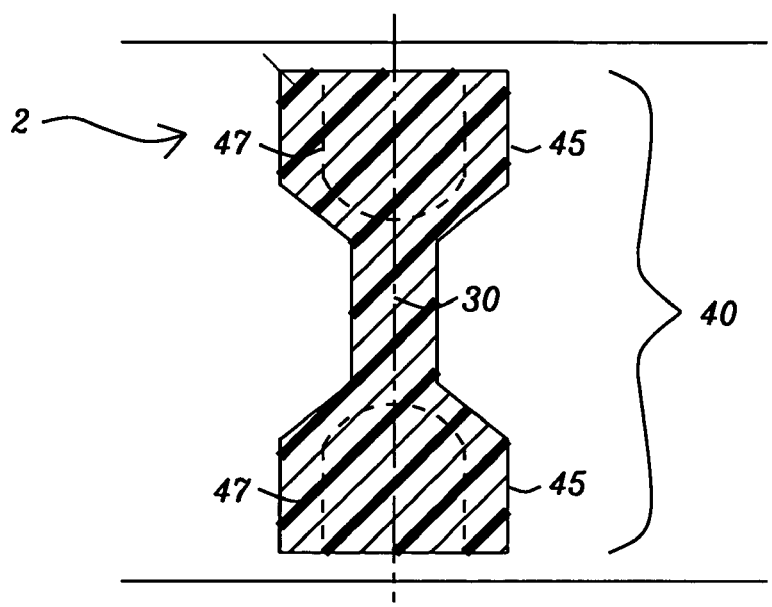

Referring next to FIG. 4a, there is shown an overhead view of a first suspension-bridge shaped bi-layer photolithographic mask (40) which has been formed on the TMR film (2). The upper portion of the mask comprises a narrow portion (30) which is suspended above (and not in contact with) a portion of the TMR film surface within which the small device being patterned will be formed. In this particular embodiment, the narrow suspended portion is substantially rectangular, in accord with the final desired shape of the device being formed. The narrow suspended portion flares out to form two broader portions (45) which support it above the film surface. The broader portions rest upon two lower support layers, each of which contact the TMR film surface with a contact area depicted in broken line outlines (47). The suspension-bridge mask is fabricated in accord with the method of Han et al. as fully disclosed in U.S. Pat. No. 6,493,926 cited above and as fully incorporated herein by reference.

Figure 4B:
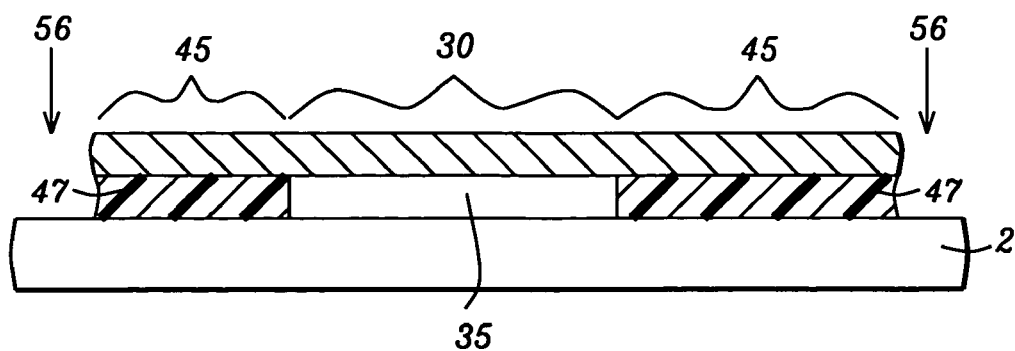

Referring to FIG. 4b, there is shown a cross-sectional view of the mask in FIG. 4a, taken through the dashed center-line in FIG. 4a. This view clearly shows the space (35) beneath the suspended center portion (30) of the mask as well as the pedestal base portions (47) upon which the mask rests and which hold it above the film surface (2). The mask is now used first as an etch mask, to remove those portions of the TMR film (2) disposed about the border of the mask by a method such as IBE (shown as arrows (56)), which is also called ion-beam milling. It is understood that the ion-beam is projected vertically downward and thereby removes portions of the TMR film surface that surround the outline of the perimeter of the mask as projected vertically downward and leaves behind a first patterned portion of the TMR film that lies vertically beneath the mask.

Figure 4C:
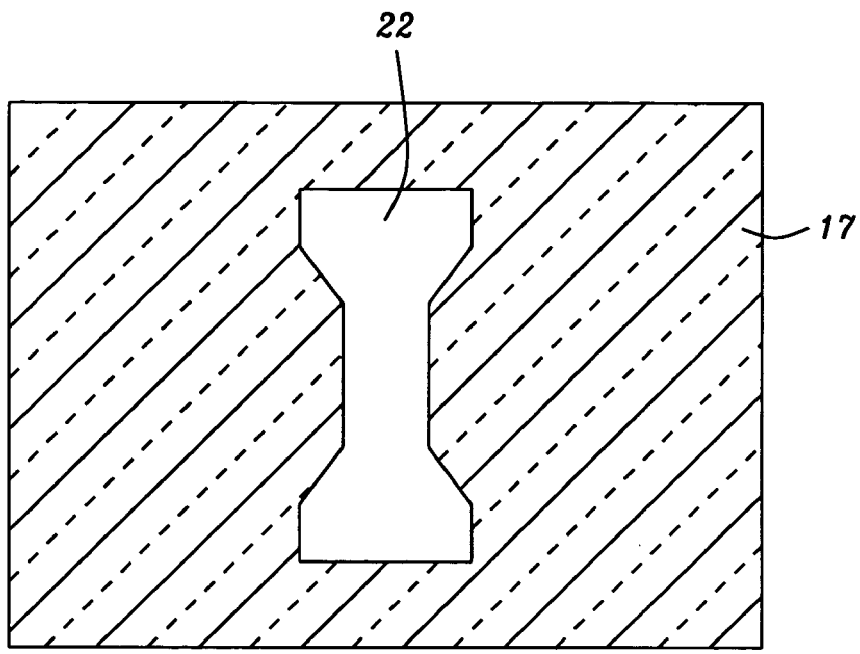

Referring next to FIG. 4c, there is shown the first patterned portion of the TMR film (22) remaining after the IBE removes the TMR film extending beyond its perimeter. The portion of the TMR film that remains, the first patterned portion, is sharply defined and has substantially the same shape as the mask. Subsequent to the film removal, the mask is used as a deposition mask to allow the formation of a dielectric refill layer (17), preferably a layer of alumina, within the region of TMR film removal. The dielectric deposition is carried out using a method such as line-of-sight ion-beam deposition. The suspension-bridge mask form allows this deposition to proceed without dielectric buildup against the patterned layer. After the refill is completed, the mask is removed by a lift-off process which dissolves the pedestal bases and is fully disclosed in Han, U.S. Pat. No. 6,493,926, fully incorporated herein by reference.

Figure 5:
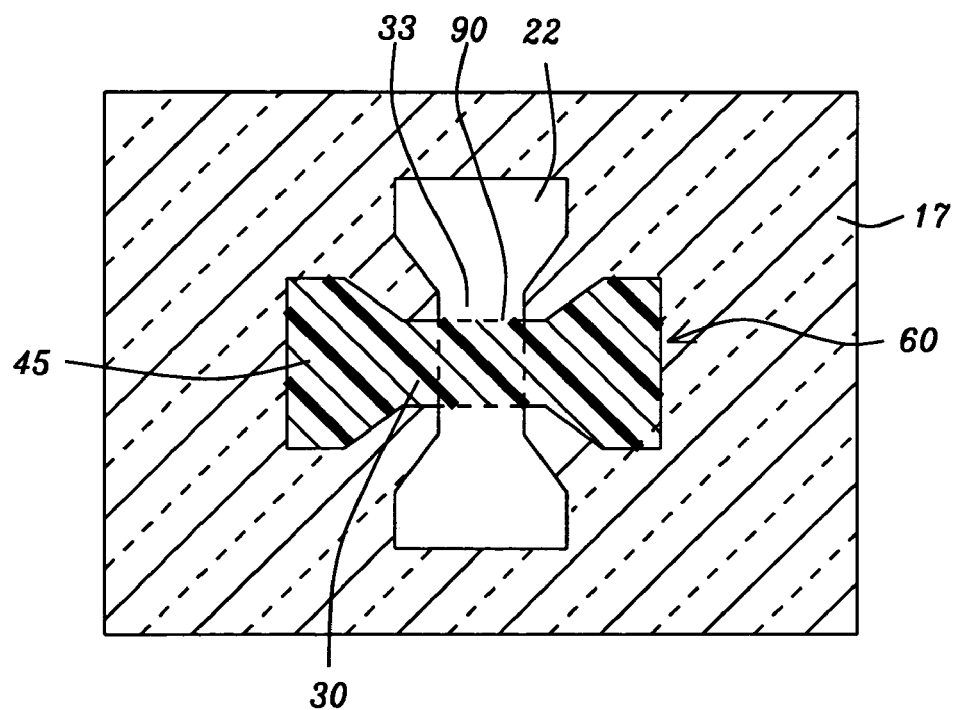

Referring next to FIG. 5, there is shown, schematically, the formation of a second suspension-bridge mask (60), formed in a structurally similar manner to the first mask in FIG. 4a, placed orthogonally across the patterned TMR film (22) that remains after the use of the first suspension-bridge mask. The second mask is positioned so that its narrow, suspended region (30) lies symmetrically across (and above) the corresponding narrow region (33) of the first patterned TMR film while the wide base of the mask (45) is formed on the dielectric refill layer (17) as shown. A square region, outlined by broken lines (90) represents the portion of the first patterned TMR film that is directly beneath the second mask and will be protected by it when a second IBE is directed vertically downward in a manner identical to that illustrated in FIG. 4b. The second IBE removes all material that is not vertically below the second mask, ie all material that extends laterally beyond the downward projected perimeter of the second mask, including all portions of the first patterned TMR film except for the boxed region and all portions of the dielectric layer (17) not beneath the mask. After the second IBE removal of the material, the second mask is now used as a deposition mask to allow a refill of the entire removed area with a second dielectric layer, preferably a layer of alumina, using a method such as line-of-sight ion beam deposition.

Figure 6A:
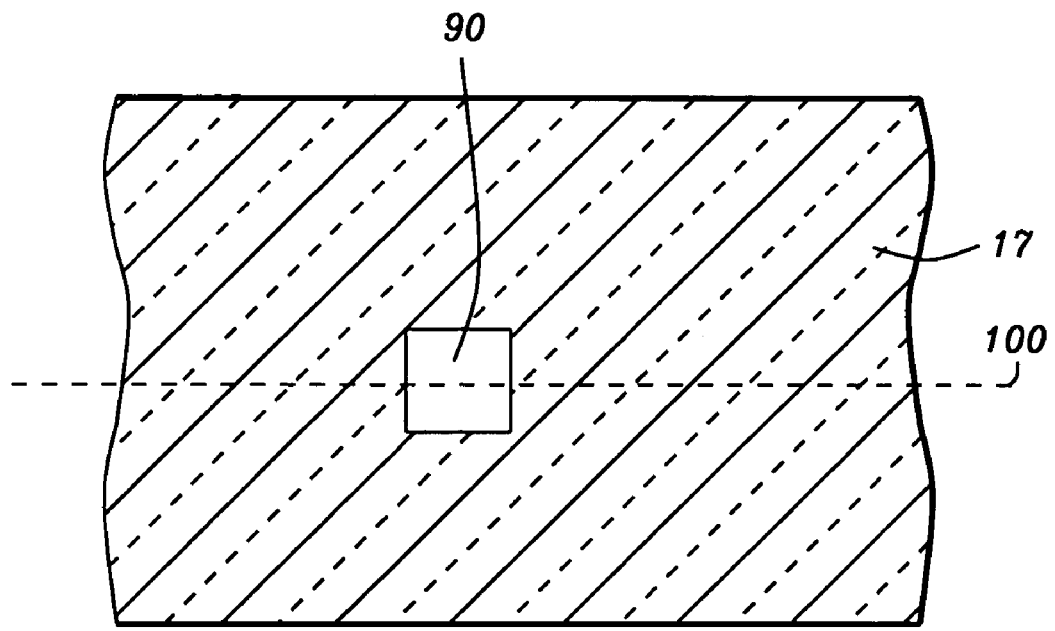
Figure 6B:
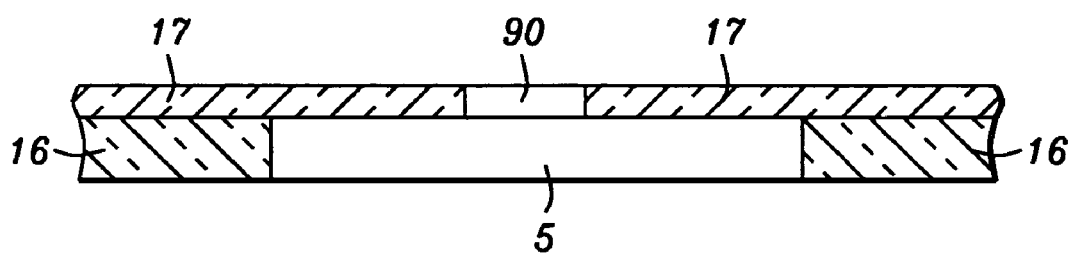

Referring to FIG. 6a, there is shown a schematic overhead view of the isolated small device (90) and the surrounding dielectric refilled layer (95) that remains after the second suspension bridge mask is removed. The small device (90) is the boxed area in FIG. 5 that was protected from the second IBE by the suspension bridge mask. The refill (17) now completely surrounds the small device. The upper surface of the device and surrounding dielectric refill has been rendered substantially planar without the need for additional planarization. This advantageous planarity is a result of the suspended nature of the mask, which prevents dielectric buildup against the perimeter of the small device. This is shown schematically in FIG. 6b, which shows the formation of FIG. 6a in a cross-sectional view through the line (100) in FIG. 6a. Once again, the device is shown as (90) and the surrounding alumina refill is shown as (17). It is important to note that although both suspension bridge masks in this preferred embodiment are structurally similar in that they are formed as a suspended central region supported by end regions that rest on pedestal bases, the central regions need not have the same shape. In fact, it is by varying the shapes of the suspended regions and the angles by which they overlap, that it becomes possible to form devices of various shapes.

Figure 7A:
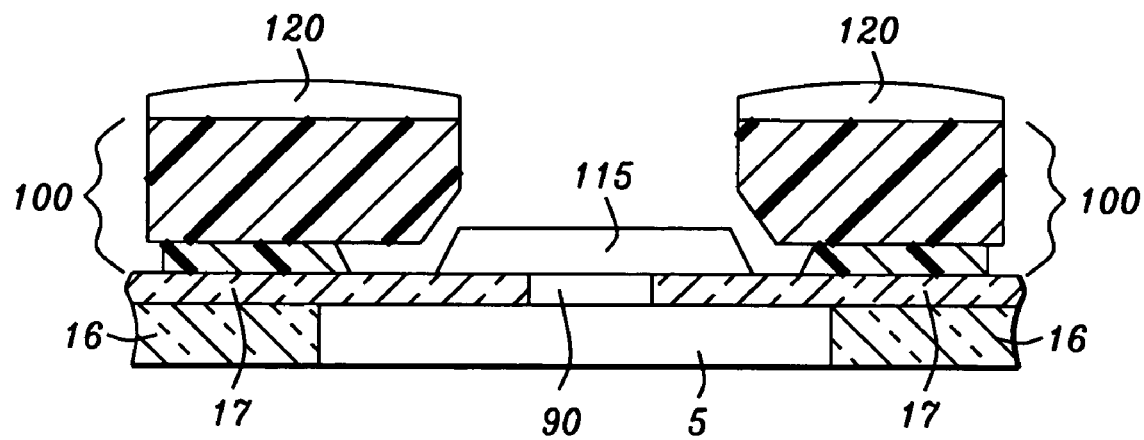
FIGS. 7a and 7b schematically show the small TMR structure of the previous figures now having an electrode formed upon it using two bi-layer lift-off masks in an additive process.

Referring now to FIGS. 7a and b, there is shown the formation of an upper electrode upon the small device (90) of FIGS. 6a & b. The formation proceeds advantageously because the method used to form the device has produced a well defined device shape and allowed for effective surface planarization. Referring first to FIG. 7a, there is shown schematically two bi-layer pedestal type lift-off masks (100) formed symmetrically disposed about the device (90). A conducting electrode layer (115) is deposited over the device through the opening between the masks (conductor residue is shown on the upper mask surfaces (120)).

Figure 7B:
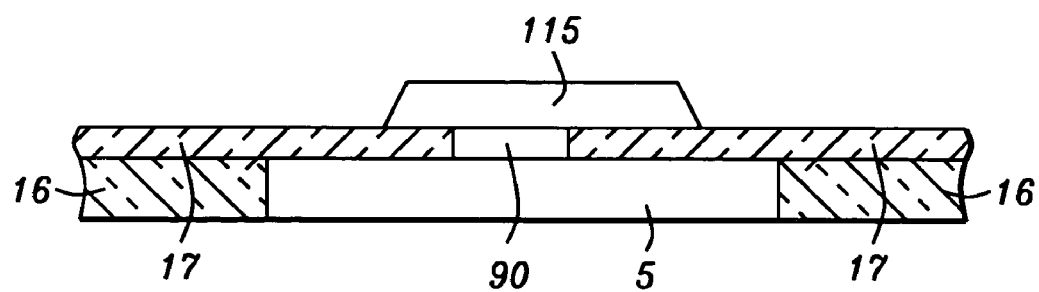

Referring finally to FIG. 7b, there is shown schematically the final structure after the lift-off of the masks. The small device (90) is now disposed between a bottom conducting electrode (5) and an upper conducting electrode (115).

It is noted yet again that the preferred embodiment has been illustrated within the context of the formation of a TMR device, which is a small patterned TMR film, laterally isolated by a dielectric insulating layer and disposed between vertically lower and upper electrodes. The device need not be a TMR device, but could be an MRAM device or a GMR read-head device, depending on the nature of the film which is patterned. Moreover, the shape of the device can be varied according to the shape of the suspension bridge. In the present embodiment, the final shape was a square, formed by the orthogonal placement of the two rectangular central mask portions. The advantage of the method is in the ease of forming the small device shape and surrounding it with dielectric that forms a co-planar surface, rather than the particular inner structure of the device.

As is understood by a person skilled in the art, the preferred embodiments of the present invention are illustrative of the present invention rather than limiting of the present invention. Revisions and modifications may be made to materials, structures and dimensions used in forming small isolated device structures, such as TMR, GMR or MRAM devices, using overlapping suspension-bridge type photolithographic masks, while still forming small isolated device structures, such as TMR, GMR or MRAM devices, using overlapping suspension-bridge type photolithographic masks in accord with the spirit and scope of the present invention as defined by the appended claims.

What is claimed is:

1. A method for forming a small, microelectronics device having a sharply defined patterned shape and surrounded by a dielectric layer having an upper surface that is substantially co-planar with the upper surface of said device, using overlapping suspension-bridge shaped photolithographic masks comprising:

providing a substrate;

forming on said substrate a device layer to be patterned;

forming on said device layer a first suspension-bridge shaped photomask, said photomask including two end portions connected by a central portion, wherein each of said end portions rests upon a pedestal base formed upon said device layer and whereby said central portion is suspended above said layer supported by said end portions;

using said first photomask as an etching mask and applying a first downwardly directed etch, removing all portions of said device layer except that portion vertically beneath said mask, the remaining portion of said device layer thereby having a sharply defined first patterned shape which is substantially the shape of said mask;

using said first photomask as a deposition mask, forming a first dielectric refill layer within said removed device layer portions, the upper surface of said refill layer and the upper surface of said first patterned device layer being substantially co-planar;

removing said first photomask;

forming a second suspension-bridge shaped photomask on said first refill layer, the second mask being structurally similar to the first mask, wherein each pedestal base portion of said second photomask is formed on the refill layer and the suspended portion of said second photomask is suspended substantially orthogonally over said first patterned device layer;

using said second photomask as an etching mask and applying a second downwardly directed etch, removing all portions of said first patterned device layer and said refill layer except those portions vertically beneath said second photomask, the remaining portion of said first patterned device layer thereby having a sharply defined second patterned shape;

using said second photomask as a deposition mask, forming a second dielectric refill layer within all portions of the first refill layer and first patterned device layer removed by said second etch, the upper surface of said second refill layer and the upper surface of said second patterned device layer being substantially co-planar;

removing said second photomask.

2. The method of claim 1 wherein said first and second etches are ion-beam etches.

3. The method of claim 1 wherein said first and second dielectric refill layers are formed by a line-of-sight ion-beam deposition.

4. The method of claim 1 wherein said first and second dielectric refill layers are layers of alumina.

5. The method of claim 1 wherein said device layer to be patterned is a TMR device layer, an MRAM device layer or a GMR device layer.

6. The method of claim 1 wherein said first and second masks have a substantially rectangularly shaped suspended central portion and wherein said second patterned shape is a square.

7. The method of claim 1 wherein the shape of the central portion of said first and second suspension bridge shaped mask is chosen to form a second patterned shape of arbitrary form.

8. The method of claim 1 further including the formation of an upper conducting electrode on the isolated device, said formation comprising:

forming a pair of separated bi-layer lift-off masks having undercut pedestal supports, said masks being symmetrically laterally disposed to either side of said isolated second patterned layer and a space between said masks allowing a deposition of conducting material on said isolated second patterned layer;

depositing a conducting electrode layer on said isolated device through said space.

* * * * *